United States Patent
Yamagami

(10) Patent No.: US 7,038,962 B2
(45) Date of Patent: May 2, 2006

(54) SEMICONDUCTOR INTEGRATED CIRCUIT

(75) Inventor: Yoshinobu Yamagami, Nagaokakyo (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 11/004,909

(22) Filed: Dec. 7, 2004

(65) Prior Publication Data

US 2005/0128844 A1    Jun. 16, 2005

(30) Foreign Application Priority Data

Dec. 15, 2003 (JP) ............... 2003-415831

(51) Int. Cl.
*G11C 7/00* (2006.01)

(52) U.S. Cl. ............... 365/205; 365/207; 365/203
(58) Field of Classification Search ............... 365/205, 365/207, 203

See application file for complete search history.

(56) References Cited

U.S. PATENT DOCUMENTS

| 5,418,749 A | 5/1995 | Suda et al. ............... 365/203 |
| 5,970,007 A * | 10/1999 | Shiratake ............... 365/207 |
| 6,111,802 A * | 8/2000 | Kano et al. ............... 365/203 |
| 6,914,840 B1 * | 7/2005 | Agata ............... 365/210 |

FOREIGN PATENT DOCUMENTS

JP    9-259589    10/1997

* cited by examiner

*Primary Examiner*—Tuan T. Nguyen
(74) *Attorney, Agent, or Firm*—Steptoe & Johnson LLP

(57) ABSTRACT

A semiconductor integrated circuit has a word line, a pair of bit lines, a memory cell disposed on an intersection of the word line and the pair of bit lines, a precharge circuit for precharging the pair of bit lines at a first voltage, and a sense amplifier circuit for amplifying a potential difference of the pair of bit lines at a second voltage. The first voltage is substantially equal to an on voltage of the sense amplifier circuit, the on voltage being obtained by adding an offset voltage of the sense amplifier circuit to an on voltage of a transistor constituting the sense amplifier circuit, or the first voltage is a voltage between the on voltage of the sense amplifier circuit and the second voltage.

16 Claims, 8 Drawing Sheets

SEMICONDUCTOR INTEGRATED CIRCUIT

FIELD OF THE INVENTION

The present invention relates to a semiconductor integrated circuit and particularly relates to a semiconductor integrated circuit having a sense amplifier circuit for amplifying a small potential difference of a pair of complementary signal lines.

BACKGROUND OF THE INVENTION

In general, semiconductor memory products such as an SRAM and DRAM have sense amplifier circuits that amplify a small potential difference outputted to a pair of bit lines from a memory cell selected by inputting an external address signal during reading. Further, the semiconductor memory products have control circuits for starting the sense amplifier circuits with optimum timing. In recent years, low power consumption, high speed, and a small area have been demanded of these circuits.

The following will describe a technique for a sense amplifier circuit of a known semiconductor integrated circuit and a technique of starting the sense amplifier circuit with optimum timing.

[First Known Technique]

First, the following will discuss a technique for a sense amplifier circuit of a known semiconductor integrated circuit. The first known technique is a sense amplifier circuit described in "CMOS VLSI DESIGN", supervised by Takuo Sugano, edited by Tetsuya Iizuka, first edition, fourth reprint, Sep. 30, 1992, published by BAIFUKAN Co., LTD, pp. 186–189. This book shows a variety of sense amplifier circuits generally used in a DRAM, SRAM, and so on.

A first example is a latch sense amplifier (shown in FIG. 5.35(a) on p. 187 of the book). The latch sense amplifier is constituted of a latch circuit of two inverters connected to a pair of bit lines. The source terminals or drain terminals of the inverters are connected to each other and are fed with a control signal for starting the sense amplifier. When the pair of bit lines has a small potential difference, the sense amplifier is started to amplify the potential difference. After amplification is completed, the bit lines are amplified to a power supply level and a GND level, respectively. Thus, no DC current path is generated in the circuit. With this configuration, the latch sense amplifier has very low power consumption.

A second example is a current mirror sense amplifier (shown in FIG. 5.36(a) on p. 188 of the book). The current mirror sense amplifier amplifies a pair of bit lines by means of a load device using a current mirror. However, as shown in the figure, a current mirror sense amplifier circuit may be increased in offset voltage due to poor symmetry and thus interfere with speedup. Further, since the current mirror sense amplifier has a small output amplitude, for example, as shown in FIG. 5.36(b) on p. 188 of the book, further amplification has to be performed in the subsequent stage of the sense amplifier circuit. In general, current mirror sense amplifiers can offer enhanced speed. However, unlike the latch sense amplifier, the current mirror sense amplifier has large power consumption because a DC current path is present in the circuit even after the completion of amplification. Since the circuit is configured using the current mirror, the circuit is unsuitable to operations performed at low power supply voltages. Further, the current mirror sense amplifier requires a control signal for starting the sense amplifier circuit as in the case of the latch sense amplifier.

A third example is a single-ended sense amplifier (shown in FIG. 5.39 on p. 189 of the book). The single-ended sense amplifier has an extremely simple configuration in which a bit line is directly inputted to an inverter. Unlike the latch sense amplifier and the current mirror sense amplifier, the single-ended sense amplifier requires no control signal for starting a sense amplifier circuit. However, the operating speed is determined by a threshold voltage (switching voltage) of the inverter. Thus, for example, when the bit line has a large load and a low amplitude velocity, amplification is not performed unless the potential of the bit line is reduced (or increased) to the threshold voltage of the inverter, resulting in a disadvantage in speedup. Moreover, when the bit line has a low amplitude velocity as described above, flow-through current is applied between the power supply of the inverter and GND, resulting in large power consumption.

[Second Known Technique]

The following will describe a known circuit technique for optimizing the start timing of a sense amplifier circuit of a semiconductor integrated circuit.

As described in the explanation of the known latch sense amplifier and current mirror sense amplifier, a sense amplifier circuit generally requires a control signal for starting the sense amplifier. Further, the sense amplifier can be started only after a potential difference of a pair of signal lines inputted to the sense amplifier circuit reaches a certain value or higher (for example, a potential difference not less than 100 mV, which is determined in consideration of the unbalanced characteristics of devices constituting the sense amplifier circuit and an offset voltage generated by the influence of coupling noise on the pair of signal lines, and a malfunction may occur unless the sense amplifier circuit is started with the potential difference or higher). Thus, a circuit is necessary for accurately detecting a potential difference of the pair of signal lines. Alternatively, the following circuit needs to be devised: in consideration of the load and driving capability of the pair of signal lines, a delay circuit or the like previously sets timing at which the pair of signal lines has a potential difference of the certain value or higher, and the start signal of the sense amplifier circuit is generated.

The second known technique of the semiconductor memory having a unit for dealing with the above problem includes a semiconductor memory disclosed in JP-A-9-259589. The semiconductor memory disclosed in JP-A-9-259589 will be simply discussed below. Some drawings and sentences are cited from the publication of unexamined application. FIG. 9 is a diagram showing the configuration of the semiconductor memory.

In FIG. 9, bit lines BL and BR are arranged longitudinally, word lines (W1 to Wn) are arranged laterally, and a plurality of memory cells (MC1 to MCn) are arranged respectively on the intersections of the bit lines and the word lines. Further, dummy bit lines DBL and DBR are arranged longitudinally. Dummy memory cells (MD1 to MDn), which are identical to the memory cells (MC1 to MCn) in structure and size, are arranged respectively on the intersections of the dummy bit lines DBL and DBR and the word lines (W1 to Wn). Moreover, the dummy bit lines DBL and DBR are inputted to a dummy sense amplifier DSA. The dummy sense amplifier outputs a signal SAD. An inverter INV is fed with the signal SAD and outputs a sense amplifier activating signal SC.

The effect of the configuration will be briefly discussed below. In addition to the normal memory cells (MC1 to MCn), the dummy memory cells (MD1 to MDn) are provided which are identical in structure to the normal memory cells, and the dummy bit lines DBL and DBR are provided which are equal in load to the normal bit lines BL and BR, so that the delay time of the normal bit lines BL and BR and the delay time of the dummy bit lines DBL and DBR can be compensated to an equal value. Thus, during reading, it is possible to generate start timing most suitable for the sense amplifier circuit based on the signals of the dummy bit lines DBL and DBR connected to the dummy memory cells (MD1 to MDn).

FIG. 9 shows a so-called replica circuit. A number of various configurations are proposed in addition to the above configuration.

However, the configurations of the first known technique and the second known technique have the following problems:

As described above, in the sense amplifier circuit discussed in the book, the latch sense amplifier and the current mirror sense amplifier require a control signal for starting the sense amplifier circuit. Hence, another circuit is necessary for generating the start timing of the sense amplifier circuit, thereby increasing a circuit area. Further, in actual memory products, all memory cells are not identical in characteristics and capability due to processing variations and so on in a semiconductor manufacturing process. Thus, a pair of bit lines (a pair of signal lines) does not have constant amplitude time. For this reason, it is normally necessary to generate the start timing of the sense amplifier circuit in synchronization with the timing of reading data from a memory cell having the lowest capability. Hence, the circuit is designed with an excessive timing margin for the start timing of the sense amplifier circuit, thereby interfering with speedup. The single-ended sense amplifier does not require a control signal for starting the sense amplifier circuit. However, as described above, when the bit line has slow transition speed, the single-ended sense amplifier is disadvantageous in speedup and flow-through current is applied between the power supply of the inverter and GND, resulting in large power consumption.

The configuration using the replica circuit disclosed in JP-A-9-259589 can generate start timing most suitable for the sense amplifier circuit. However, in general, the replica circuit additionally requires dummy memory cells other than memory cells and requires a control circuit or the like for generating the start timing of the sense amplifier circuit in response to a signal from the dummy bit line, thereby increasing a circuit area. Further, in actual memory products, all memory cells are not identical in characteristics due to processing variations and so on in a semiconductor manufacturing process. Thus, normally memory cells and dummy memory cells are not identical in characteristics and thus a pair of bit lines and a pair of dummy bit lines do not have constant amplitude time. For this reason, it is generally necessary to generate the start timing of the sense amplifier circuit in synchronization with the timing of reading data from a memory cell having the lowest capability. Hence, the circuit is designed with an excessive timing margin for the start timing of the sense amplifier circuit, thereby interfering with speedup.

SUMMARY OF THE INVENTION

An object of the present invention is to provide a semiconductor integrated circuit which eliminates the need for generating a start signal of a sense amplifier circuit and achieves low power consumption, high speed, and a small area in the sense amplifier circuit for amplifying a small potential difference of a pair of complementary signal lines.

In order to attain the object, the semiconductor integrated circuit is configured as below:

A semiconductor integrated circuit, comprising a word line, a pair of bit lines, a memory cell disposed on an intersection of the word line and the pair of bit lines, a precharge circuit for precharging the pair of bit lines at a first voltage, and a sense amplifier circuit for amplifying a potential difference of the pair of bit lines at a second voltage, wherein the first voltage is substantially equal to an on voltage of the sense amplifier circuit, the on voltage being obtained by adding an offset voltage of the sense amplifier circuit to an on voltage of a transistor constituting the sense amplifier circuit, or the first voltage is a voltage between the on voltage of the sense amplifier circuit and the second voltage.

Preferably, in the above integrated circuit, the sense amplifier circuit is controlled by a sense amplifier circuit control signal, and the complementary output of the sense amplifier circuit has a same voltage level in response to the sense amplifier circuit control signal when the sense amplifier circuit is deactivated.

Preferably, in the above integrated circuit, the sense amplifier circuit has first to fourth transistors. A power supply of the second voltage is connected to source terminals of the first and second transistors, signal lines from the pair of bit lines are connected respectively to the gate terminals of the first and second transistors, source terminals of the third and fourth transistors are grounded, a sense amplifier circuit control signal line is connected to the gate terminals of the third and fourth transistors, drain terminals of the first and third transistors are connected to each other so as to constitute one of the complementary outputs of the sense amplifier circuit, and drain terminals of the second and fourth transistors are connected to each other to constitute the other of the complementary output of the sense amplifier circuit.

Preferably, in the above integrated circuit, the sense amplifier circuit further has fifth and sixth transistors. Source terminals of the fifth and sixth transistors are grounded, a drain terminal of the fifth transistor is connected to the drain terminal of the first transistor, a gate terminal of the fifth transistor is connected to the drain terminal of the second transistor, a drain terminal of the sixth transistor is connected to the drain terminal of the second transistor, and a gate terminal of the sixth transistor is connected to the drain terminal of the first transistor.

Preferably, in the above integrated circuit, when the sense amplifier circuit is deactivated, power of the sense amplifier circuit is turned off by the sense amplifier circuit control signal.

Preferably, the semiconductor integrated circuit comprises an amplification detection circuit which has an input terminal to which the complementary output of the sense amplifier circuit is fed, and a circuit which deactivates the sense amplifier circuit and the word line and activates the precharge circuit based on the output of the amplification detection circuit.

Preferably, in the above integrated circuit, a wire for creating a shield against the influence of coupling between a pair of signal lines to the sense amplifier circuit is formed inside the pair of signal lines inputted.

Preferably, in the above integrated circuit, a pair of wires for creating a shield against the influence of coupling on the pair of signal lines to the sense amplifier circuit is formed outside the pair of signal lines inputted.

According to another aspect of the present invention, a semiconductor integrated circuit comprising a pair of complementary signal lines, a precharger for precharging the pair of complementary signal lines at a first voltage, and an amplifier for amplifying a potential difference of the pair of complementary signal lines at a second voltage, wherein the first voltage is substantially equal to an on voltage of the amplifier, the on voltage being obtained by adding an offset voltage of the amplifier to an on voltage of a transistor constituting the amplifier, or the first voltage is a voltage between the on voltage of the amplifier and the second voltage.

Preferably, in the above integrated circuit, the amplifier is controlled by an amplifier control signal, and a complementary output of the amplifier has a same voltage level in response to the amplifier control signal when the amplifier is deactivated.

Preferably, in the above integrated circuit, the amplifier has first to fourth transistors. A power supply of the second voltage is connected to source terminals of the first and second transistors, the complementary signal lines are connected respectively to gate terminals of the first and second transistors, source terminals of the third and fourth transistors are grounded, an amplifier control signal line is connected to gate terminals of the third and fourth transistors, drain terminals of the first and third transistors are connected to each other to constitute one of the complementary output of the amplifier, and drain terminals of the second and fourth transistors are connected to each other to constitute the other of the complementary output of the amplifier.

Preferably, in the above integrated circuit, the amplifier further has fifth and sixth transistors. Source terminals of the fifth and sixth transistors are grounded, a drain terminal of the fifth transistor is connected to the drain terminal of the first transistor, a gate terminal of the fifth transistor is connected to the drain terminal of the second transistor, a drain terminal of the sixth transistor is connected to the drain terminal of the second transistor, and a gate terminal of the sixth transistor is connected to the drain terminal of the first transistor.

Preferably, in the above integrated circuit, when the amplifier is deactivated, power of the amplifier is turned off by an amplifier control signal.

Preferably, in the above integrated circuit, the semiconductor integrated circuit comprises an amplification detector which has an input terminal to which the complementary output of the amplifier is fed, and a circuit which turns off power of the amplifier and activates the precharger based on the output of the amplification detector.

Preferably, in the above integrated circuit, a wire for creating a shield against the influence of coupling between the pair of complementary signal lines inputted to the amplifier is formed inside the pair of complementary signal lines.

Preferably, in the above integrated circuit, a pair of wires for creating a shield against the influence of coupling on the pair of complementary signal lines inputted to the amplifier is formed outside the pair of complementary signal lines.

According to a preferred embodiment of the semiconductor integrated circuit of the present invention, a pair of signal lines inputted to a sense amplifier circuit has a precharge voltage of VDD1, the sense amplifier circuit has a power supply VDD2, a transistor constituting the sense amplifier circuit has a threshold voltage of VTH, and the sense amplifier circuit has an offset voltage of VOFFSET. For the pair of signal lines inputted to the sense amplifier circuit, the precharge voltage VDD1 is set so as to be equal to a voltage VON, which is expressed by VON=VDD2−VTH−VOFFSET. Thus, no malfunction occurs in the amplification of the sense amplifier circuit and high-speed amplification can be performed.

In the semiconductor integrated circuit, the sense amplifier circuit automatically operates in response to the voltage of the pair of bit lines. Thus, like the second known technique, it is not necessary to generate a control signal for starting the sense amplifier circuit with optimum timing, thereby eliminating the need for an extra timing margin for starting the sense amplifier circuit. Moreover, since a control signal for starting the sense amplifier circuit is unnecessary, a circuit for generating the control signal is not necessary and thus the circuit can have a smaller area.

According to another preferred embodiment of the semiconductor integrated circuit of the present invention, the sense amplifier circuit only drives P-type MOS transistors (to be specific, the first and second transistors) during amplification. Thus, unlike the single-ended sense amplifier of the first known technique, unwanted flow-through current is not applied in the sense amplifier circuit, achieving low power consumption.

According to still another preferred embodiment of the semiconductor integrated circuit of the present invention, the sense amplifier circuit has the cross-connected N-type MOS transistors. Thus, it is possible to prevent the complementary output of the sense amplifier circuit from being increased to H level by an off leak current, and to more positively perform amplification in the sense amplifier circuit.

According to still another preferred embodiment of the semiconductor integrated circuit of the present invention, the off leak current applied to the sense amplifier circuit can be completely interrupted by inserting a P-type MOS transistor in series between the power supply terminal VDD2 of the sense amplifier circuit and the P-type MOS transistors.

Furthermore, the semiconductor integrated circuit comprises a circuit for detecting the completion of the amplification of the sense amplifier circuit, and controls the sense amplifier circuit by using the output signal of the detection circuit. Thus, it is possible to operate the sense amplifier circuit only in a minimum time period, achieving low power consumption.

Additionally, the semiconductor integrated circuit comprises a circuit for detecting the completion of the amplification of the sense amplifier circuit, and controls the word line and the precharge circuit of the pair of bit lines by using the output signal of the detection circuit. Thus, the word line is activated only in the minimum time period, resulting in low power consumption and a speedup due to a shorter cycle time.

Besides, the semiconductor integrated circuit comprises a shield wire for reducing a coupling capacitance between the pair of bit lines, thereby preventing an increase in power consumption and a malfunction of the sense amplifier circuit.

Further, the semiconductor integrated circuit comprises a shield wire for reducing a coupling capacitance between the pair of bit lines and a wire adjacent to the pair of bit lines, thereby preventing an increase in power consumption and a malfunction of the sense amplifier circuit.

DESCRIPTION OF THE PREFERRED EMBODIMENTS

Most preferred embodiments for the present invention will be specifically described below with reference to the accompanying drawings.

Embodiment 1

Figure 1:
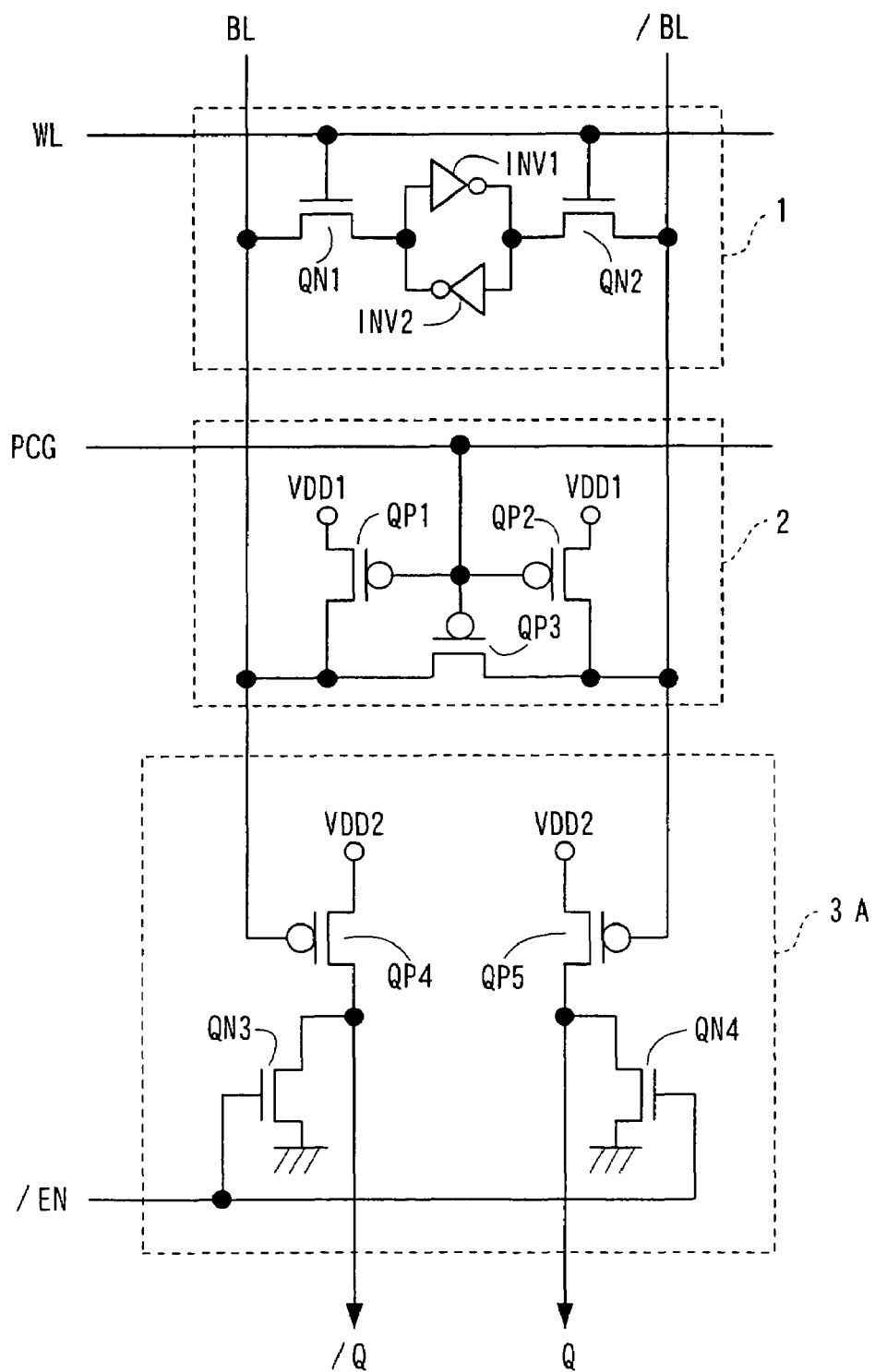
FIG. 1 is a diagram showing the configuration of a semiconductor integrated circuit according to Embodiment 1 of the present invention.

FIG. 1 shows the configuration of a semiconductor integrated circuit according to Embodiment 1 of the present invention.

The semiconductor integrated circuit of FIG. 1 has a memory cell 1, a precharge circuit 2, a sense amplifier circuit 3A, a word line WL, and a pair of bit lines BL and /BL. Reference character PCG denotes a precharge circuit control signal and reference character /EN denotes a sense amplifier circuit control signal. The memory cell 1 has N-type MOS transistors QN1 and QN2 and inverters INV1 and INV2. The precharge circuit 2 has P-type MOS transistors QP1, QP2, and QP3 and a first power supply terminal VDD1. The sense amplifier circuit 3A has P-type MOS transistors QP4 and QP5, N-type MOS transistors QN3 and QN4, and a second power supply terminal VDD2. Reference characters Q and /Q denote the complementary outputs of the sense amplifier circuit 3A.

The gate terminals of the N-type MOS transistors QN1 and QN2 constituting the memory cell 1 are connected to the word line WL, the drain terminals of the transistors are connected respectively to the pair of bit lines BL and /BL, and the source terminals of the transistors are connected respectively to the input terminals of the inverters INV1 and INV2. Further, the output terminal of the inverter INV1 is connected to the input terminal of the inverter INV2 and the output terminal of the inverter INV2 is connected to the input terminal of the inverter INV1 so as to constitute a latch circuit.

The latch circuit stores data. The memory cell 1 outputs stored data to the pair of bit lines BL and /BL when the word line WL is at H level. Alternatively, the memory cell 1 receives complementary data having been transmitted through the pair of bit lines BL and /BL when the word line WL is at H level. When the word line WL is at L level, the memory cell 1 is brought to a high impedance state (a state where no data is inputted or outputted).

The gate terminals of the P-type MOS transistors QP1 to QP3 constituting the precharge circuit 2 are connected to the line of the precharge circuit control signal PCG. The source terminals of the P-type MOS transistors QP1 and QP2 are connected to first power supply terminal VDD1, and the drain terminals of the transistors are connected to the pair of bit lines BL and /BL, respectively. Moreover, the source terminal and the drain terminal of the P-type MOS transistor QP3 are connected to the pair of bit lines BL and /BL, respectively.

The precharge circuit 2 is activated when the precharge circuit control signal PCG is at L level and precharges the pair of bit lines BL and /BL to a level of voltage applied to the first power supply terminal VDD1. When the precharge circuit control signal PCG is at H level, the precharge circuit 2 is deactivated and brought to the high impedance state.

The source terminals of the P-type MOS transistors QP4 and QP5 constituting the sense amplifier circuit 3A are connected to the second power supply terminal VDD2, and the gate terminals of the transistors are connected to the pair of bit lines BL and /BL, respectively. The source terminals of the N-type MOS transistors QN3 and QN4 are grounded, and the gate terminals of the transistors are connected to the line of the sense amplifier circuit control signal /EN. The drain terminals of the P-type MOS transistor QP4 and the N-type MOS transistor QN3 are connected to each other and the drain terminals of the P-type MOS transistor QP5 and the N-type MOS transistor QN4 are connected to each other so as to constitute the complementary outputs /Q and Q of the sense amplifier circuit 3A.

The following will describe the operations of the semiconductor integrated circuit configured thus.

First, when the word line WL is at L level, the precharge circuit control signal PCG is at L level, the precharge circuit 2 is activated, and the pair of bit lines BL and /BL is precharged to H level. Thus, the P-type MOS transistors QP4 and QP5 are turned off, in which the pair of bit lines BL and /BL are inputted to the gate terminals. At this point, the sense amplifier circuit control signal /EN is at H level, the N-type MOS transistors QN3 and QN4 are turned on, in which the sense amplifier circuit control signal /EN is inputted to the gate terminals, and the complementary outputs Q and /Q of the sense amplifier circuit 3A are L level.

Then, the precharge circuit control signal PCG is changed from L level to H level and the precharge circuit 2 is brought to the high impedance state. Further, the sense amplifier circuit control signal /EN is changed from H level to L level, and the word line WL is changed from L level to H level. Since the word line WL is changed to H level, the data stored in the memory cell 1 is read to the pair of bit lines BL and /BL. For example, it is assumed that the bit line BL is at L level and the bit line /BL is at H level. Since the bit line /BL is at H level, the P-type MOS transistor QP5, in which the bit line /BL is inputted to the gate terminal, is always turned off when the word line WL is at H level. The bit line BL gradually changes from H level to L level while discharging from H level to which charging has been performed by the precharge circuit 2. When the bit line BL is reduced in potential to a value exceeding a threshold voltage of the P-type MOS transistor QP4, in which the bit line BL is inputted to the gate terminal, the P-type MOS transistor QP4 is turned on and the complementary output /Q of the sense amplifier circuit 3A changes from L level to H level. Hence, the sense amplifier circuit 3A amplifies the potential difference of the pair of bit lines BL and /BL.

When the word line WL is changed from H level to L level, the memory cell 1 is brought to the high impedance state (a state where no data is inputted or outputted). Further, the sense amplifier circuit control signal /EN is changed from L level to H level, and the complementary outputs Q and /Q of the sense amplifier circuit 3A output L level again. Moreover, the precharge circuit control signal PCG is changed from H level to L level, and the precharge circuit 2 is activated again to precharge the pair of bit lines BL and /BL to H level.

These operations are repeated.

The precharge voltage of the pair of bit lines BL and /BL is equal to the voltage of the power supply terminal VDD1 of the precharge circuit 2. The power supply terminal VDD2 is connected to the source terminals of the P-type MOS transistors QP4 and QP5 constituting the sense amplifier circuit 3A. Further, when the P-type MOS transistors QP4 and QP5 have a threshold voltage VTH (absolute value) and the P-type MOS transistors QP4 and QP5 are turned on at a voltage VON1, VON1 =VDD2−VTH is established.

Thus, when the precharge voltage VDD1 of the pair of bit lines BL and /BL is set at the same value as the voltage VON1, immediately after the word line WL is changed to H level and data stored in the memory cell 1 is read to the pair of bit lines BL and /BL, one of the P-type MOS transistors QP4 and QP5 constituting the sense amplifier circuit 3A is turned on (whether the P-type MOS transistor QP4 or QP5 is turned on is determined by the data stored in the memory cell 1), thereby enabling high-speed amplification. As described in the first known technique, the sense amplifier circuit 3A has an offset voltage, which is represented as VOFFSET. Hence, when the precharge voltage VDD1 of the pair of bit lines BL and /BL is set so as to be equal to the voltage VON, which is expressed by VON=VDD2−VTH−VOFFSET, no malfunction occurs in the amplification of the sense amplifier circuit and high-speed amplification can be performed. Further, even if the precharge voltage VDD1 of the pair of bit lines BL and /BL is set higher than the voltage VON, when the precharge voltage VDD1 is lower than the power supply VDD2 of the sense amplifier circuit, no malfunction occurs in the amplification of the sense amplifier circuit, thereby achieving high-speed amplification with stability.

Additionally, the sense amplifier circuit of Embodiment 1 is configured so that the sense amplifier circuit automatically operates in response to the voltage of the pair of bit lines BL and /BL. Thus, like the second known technique, it is not necessary to generate a control signal for starting the sense amplifier circuit with optimum timing, thereby eliminating the need for an extra timing margin for starting the sense amplifier circuit. Moreover, since a control signal for starting the sense amplifier circuit is unnecessary, a circuit for generating the signal is not necessary and thus the circuit can have a smaller area.

In the sense amplifier circuit of Embodiment 1, only the P-type MOS transistor (QP4 or QP5) is driven during amplification. Thus, unlike the single-ended sense amplifier of the first known technique, unwanted flow-through current is not applied in the sense amplifier circuit, achieving low power consumption.

For simple explanation of the principal contents of the present invention, the semiconductor integrated circuit of FIG. 1 is constituted of a small number of elements including the memory cell 1, the precharge circuit 2, the sense amplifier circuit 3A, the word line WL, and the pair of bit lines BL and /BL. A plurality of (or a number of) elements may be provided and the same effect as FIG. 1 can be obtained. In Embodiment 1, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

Embodiment 2

Figure 2:
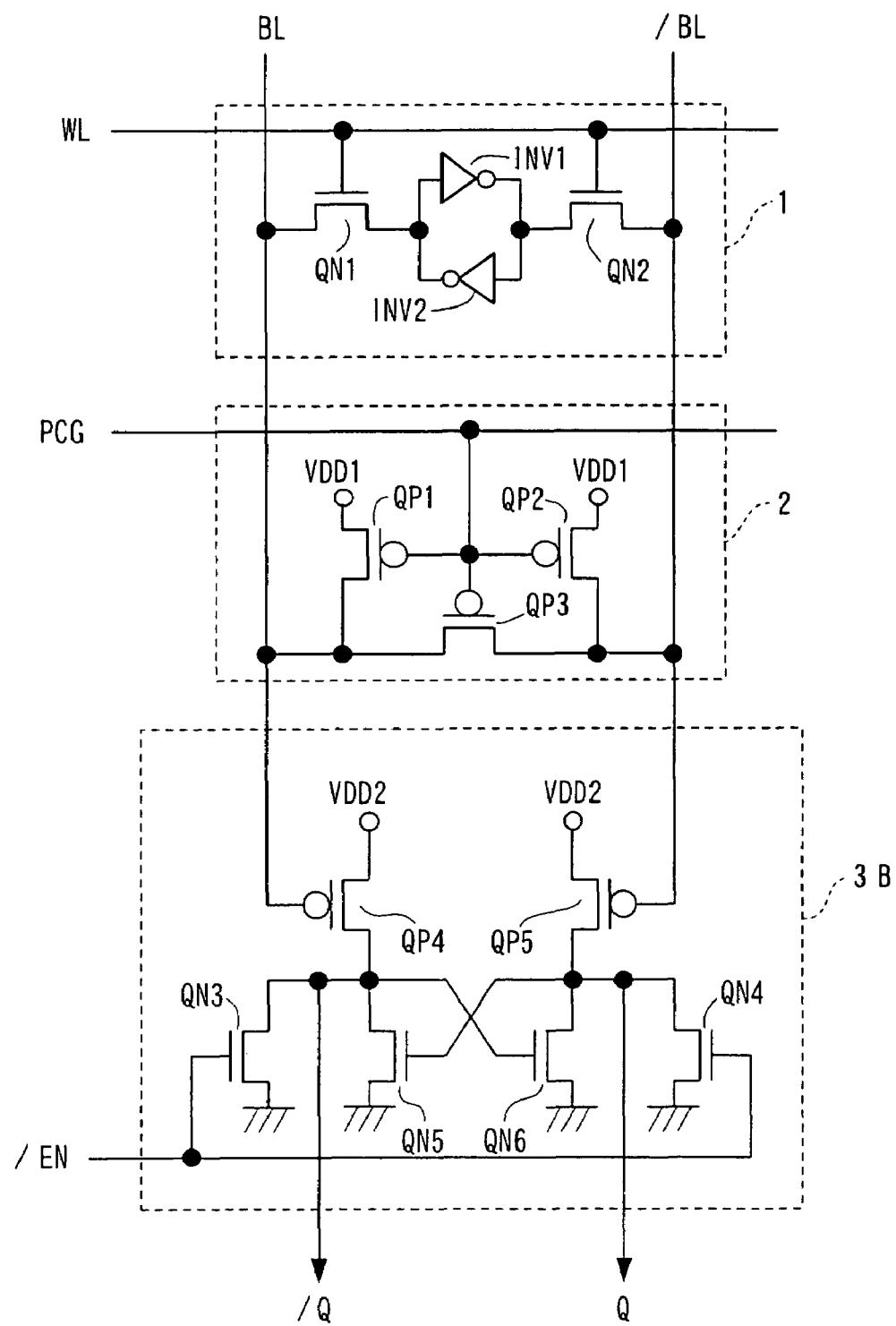
FIG. 2 is a diagram showing the configuration of a semiconductor integrated circuit according to Embodiment 2 of the present invention.

FIG. 2 shows the configuration of a semiconductor integrated circuit according to Embodiment 2 of the present invention.

The semiconductor integrated circuit of FIG. 2 has a memory cell 1, a precharge circuit 2, a sense amplifier circuit 3B, a word line WL, and a pair of bit lines BL and /BL. Reference character PCG denotes a precharge circuit control signal and reference character /EN denotes a sense amplifier circuit control signal. The memory cell 1 and the precharge circuit 2 are configured as of Embodiment 1.

The sense amplifier circuit 3B has P-type MOS transistors QP4 and QP5, N-type MOS transistors QN3 to QN6, and a second power supply terminal VDD2. Reference characters Q and /Q denote the complementary outputs of the sense amplifier circuit 3B.

The source terminals of the P-type MOS transistors QP4 and QP5 constituting the sense amplifier circuit 3B are connected to the second power supply terminal VDD2, and the gate terminals of the transistors are connected to the pair of bit lines BL and /BL, respectively. The source terminals of the N-type MOS transistors QN3 and QN4 are grounded, and the gate terminals of the transistors are connected to the sense amplifier circuit control signal /EN. The drain terminals of the P-type MOS transistor QP4 and the N-type MOS transistor QN3 are connected to each other and the drain terminals of the P-type MOS transistor QP5 and the N-type MOS transistor QN4 are connected to each other so as to constitute the complementary outputs /Q and Q of the sense amplifier circuit 3B. The source terminals of the N-type MOS transistors QN5 and QN6 are grounded and the gate terminals and the drain terminals of the transistors are cross-coupled respectively to the complementary outputs Q and /Q of the sense amplifier circuit 3B.

That is, the sense amplifier circuit 3B of the semiconductor integrated circuit according to Embodiment 2 is configured as follows: the N-type MOS transistors QN5 and QN6 are added to the complementary outputs Q and /Q of the sense amplifier circuit 3A shown in FIG. 1 of Embodiment 1. The source terminals of the N-type MOS transistors QN5 and QN6 are grounded and the gate terminals and the drain terminals of the transistors are cross-coupled respectively to the complementary outputs Q and /Q of the sense amplifier circuit 3A.

The following will describe the operations of the semiconductor integrated circuit configured thus.

First, when the word line WL is at L level, the precharge circuit control signal PCG is at L level, the precharge circuit 2 is activated, and the pair of bit lines BL and /BL is precharged to H level. Thus, the P-type MOS transistors QP4 and QP5 are turned off, in which the pair of bit lines BL and /BL are inputted to the gate terminals. At this point, the sense amplifier circuit control signal /EN is at H level, the N-type MOS transistors QN3 and QN4 are turned on, in which the sense amplifier circuit control signal /EN is inputted to the gate terminals, and the complementary outputs Q and /Q of the sense amplifier circuit 3B are L level. Thus, the N-type MOS transistors QN5 and QN6 are turned off, in which the complementary outputs Q and /Q of the sense amplifier circuit 3B are inputted to the gate terminals, and the same operations as Embodiment 1 are performed.

Then, the precharge circuit control signal PCG is changed from L level to H level and the precharge circuit 2 is brought to a high impedance state. Further, the sense amplifier circuit control signal /EN is changed from H level to L level and the word line WL is changed from L level to H level. Since the word line WL is brought to H level, data stored in the memory cell 1 is read to the pair of bit lines BL and /BL. For example, it is assumed that the bit line BL is at L level and the bit line /BL is at H level. Since the bit line /BL is at H level, the P-type MOS transistor QP5, in which the bit line /BL is inputted to the gate terminal, is always turned off when the word line WL is at H level. The bit line BL gradually changes from H level to L level while discharging from H level to which charging has been performed by the precharge circuit 2. When the bit line BL is reduced in potential to a value exceeding a threshold voltage of the P-type MOS transistor QP4, in which the bit line BL is inputted to the gate terminal, the P-type MOS transistor QP4 is turned on and the complementary output /Q of the sense amplifier circuit 3B changes from L level to H level. Then, the N-type MOS transistor QN6 is turned on, in which the complementary output /Q of the sense amplifier circuit 3B is inputted to the gate terminal, and thus the other output Q positively outputs L level. Further, since the other complementary output Q of the sense amplifier circuit 3B is at L level, the N-type MOS transistor QN5 is turned off, in which the output Q is inputted to the gate terminal, and thus the output /Q is not affected. Consequently, the sense amplifier circuit 3B amplifies a potential difference of the pair of bit lines BL and /BL.

When the word line WL is changed from H level to L level, the memory cell 1 is brought to the high impedance state (a state where no data is inputted or outputted). Further, the sense amplifier circuit control signal /EN is changed from L level to H level, and the complementary outputs Q and /Q of the sense amplifier circuit 3B output L level again. Thus, the N-type MOS transistors QN5 and QN6 are turned off, in which the complementary outputs Q and /Q of the sense amplifier circuit 3B are inputted to the gate terminals, and the same operations as Embodiment 1 are performed. Moreover, the precharge circuit control signal PCG is changed from H level to L level, and the precharge circuit 2 is activated again to precharge the pair of bit lines BL and /BL to H level.

These operations are repeated.

As described above, it is found that almost the same operations as Embodiment 1 are performed in Embodiment 2.

As in Embodiment 1, when the precharge voltage VDD1 of the pair of bit lines BL and /BL is set so as to be equal to a voltage VON, which is expressed by VON=VDD2−VTH−VOFFSET, the P-type MOS transistors QP4 and QP5 constituting the sense amplifier circuit 3B have a gate voltage around a threshold voltage and thus an off leak current increases inevitably. Hence, even when the word line WL is at H level and one of the bit lines is reduced in potential to L level, H level can be normally outputted from the complementary output of the sense amplifier circuit where the bit line is reduced to L level (e.g., the complementary output /Q of the sense amplifier circuit where the bit line BL is reduced to L level, and the output /Q is the output of the P-type MOS transistor QP4 having the bit line BL as an input). Even though the other complementary output (Q) should output L level, the output Q may gradually increase from L level to H level due to the off leak current. By adding the N-type MOS transistors QN5 and QN6 cross-coupled to each other, it is possible to prevent the complementary output (Q) of the sense amplifier circuit from being increased to H level by the off leak current.

As described above, in addition to the effect of Embodiment 1, by adding the N-type MOS transistors QN5 and QN6 cross-coupled to each other, it is possible to more positively perform amplification in the sense amplifier circuit 3B.

For simple explanation of the principal contents of the present invention, the semiconductor integrated circuit of FIG. 2 is constituted of a small number of elements including the memory cell 1, the precharge circuit 2, the sense amplifier circuit 3B, the word line WL, and the pair of bit lines BL and/BL. A plurality of (or a number of) elements may be provided and the same effect as FIG. 2 can be obtained. In Embodiment 2, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

Embodiment 3

Figure 3:
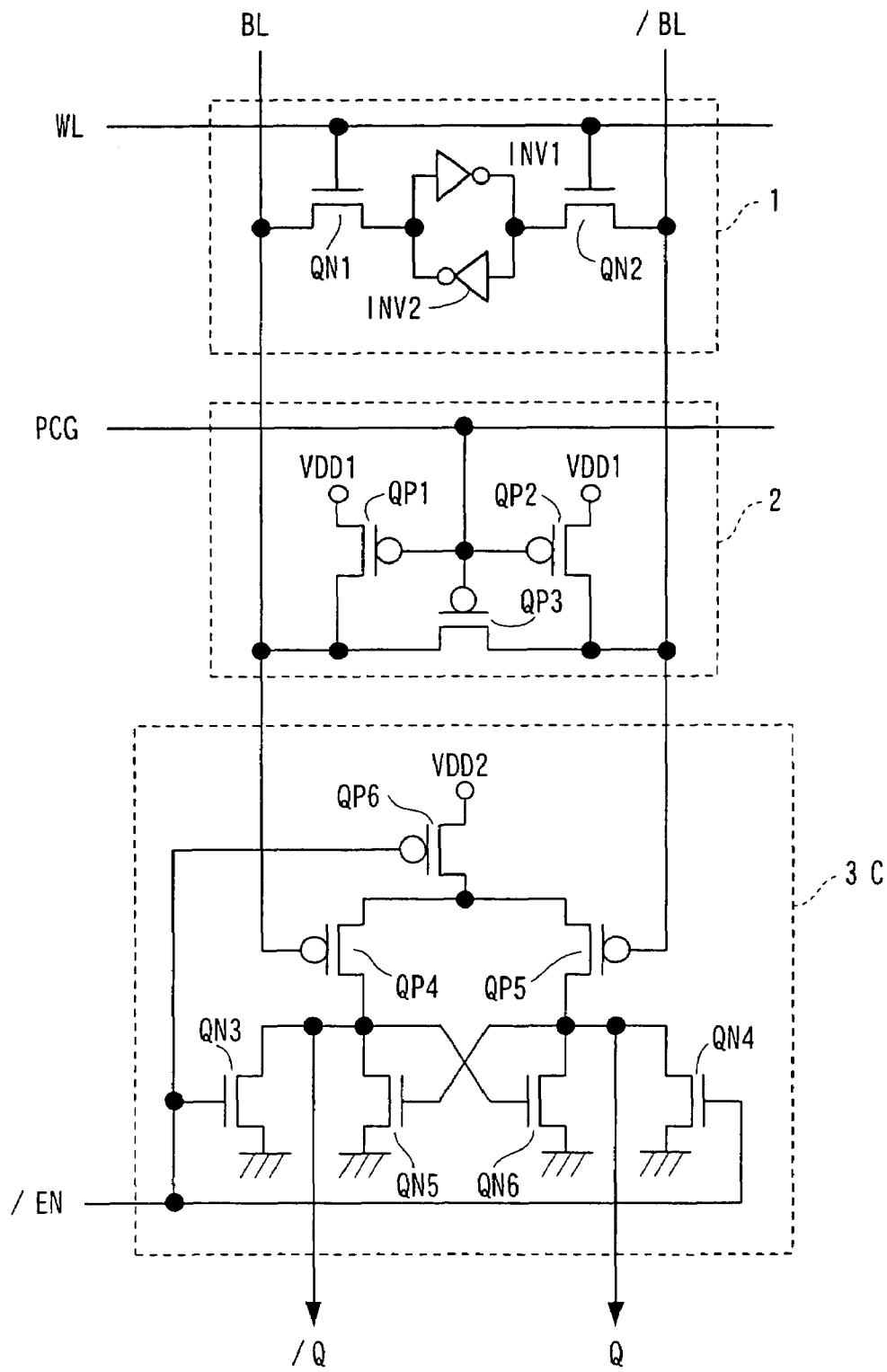
FIG. 3 is a diagram showing the configuration of a semiconductor integrated circuit according to Embodiment 3 of the present invention.

FIG. 3 shows the configuration of a semiconductor integrated circuit according to Embodiment 3 of the present invention.

The semiconductor integrated circuit of FIG. 3 has a memory cell 1, a precharge circuit 2, a sense amplifier circuit 3C, a word line WL, and a pair of bit lines BL and /BL. Reference character PCG denotes a precharge circuit control signal and reference character /EN denotes a sense amplifier circuit control signal. The memory cell 1 and the precharge circuit 2 are configured as of Embodiment 1.

The sense amplifier circuit 3C has P-type MOS transistors QP4 to QP6, N-type MOS transistors QN3 to QN6, and a second power supply terminal VDD2. Reference numerals Q and /Q denote the complementary outputs of the sense amplifier circuit 3C.

The P-type MOS transistor QP6 constituting the sense amplifier circuit 3C is connected in series between the source terminals of the P-type MOS transistors QP4 and QP5 and the second power supply terminal VDD2, and the sense amplifier circuit control signal /EN is inputted to the gate terminal of the transistor QP6. The gate terminals of the P-type MOS transistors QP4 and QP5 are connected to the pair of bit lines BL and /BL, respectively. The source terminals of the N-type MOS transistors QN3 and QN4 are grounded, and the gate terminals of the transistors are connected to the sense amplifier circuit control signal /EN. The drain terminals of the P-type MOS transistor QP4 and the N-type MOS transistor QN3 are connected to each other and the drain terminals of the P-type MOS transistor QP5 and the N-type MOS transistor QN4 are connected to each other so as to constitute the complementary outputs /Q and Q of the sense amplifier circuit 3C. The source terminals of the N-type MOS transistors QN5 and QN6 are grounded and the gate terminals and the drain terminals of the transistors are cross-coupled respectively to the complementary outputs Q and /Q of the sense amplifier circuit 3C.

The sense amplifier circuit 3C of the semiconductor integrated circuit according to Embodiment 3 is configured as follows: the P-type MOS transistor QP6, in which the gate terminal is connected to the sense amplifier circuit control signal /EN, is connected in series between the second power supply terminal VDD2 and the source terminals of the P-type MOS transistors QP4 and QP5 constituting the sense amplifier circuit 3B of Embodiment 2 shown in FIG. 2.

The following will describe the operations of the semiconductor integrated circuit configured thus.

First, when the word line WL is at L level, the precharge circuit control signal PCG is at L level, the precharge circuit 2 is activated, and the pair of bit lines BL and /BL is precharged to H level. Thus, the P-type MOS transistors QP4 and QP5 are turned off, in which the pair of bit lines BL and /BL are inputted to the gate terminals. At this point, the sense amplifier circuit control signal /EN is at H level, the N-type MOS transistors QN3 and QN4 are turned on, in which the sense amplifier circuit control signal /EN is inputted to the gate terminals, and the complementary outputs Q and /Q of the sense amplifier circuit 3C are L level. Thus, the N-type MOS transistors QN5 and QN6 are turned off, in which the complementary outputs Q and /Q of the sense amplifier circuit 3C are inputted to the gate terminals. The P-type MOS transistor QP6 is also turned off and the same operations are performed as Embodiment 2.

Then, when the precharge circuit control signal PCG is changed from L level to H level, the precharge circuit 2 is brought to a high impedance state. Further, the sense amplifier circuit control signal /EN is changed from H level to L level, and the word line WL is changed from L level to H level. At this point, the sense amplifier circuit control signal /EN is at L level, the P-type MOS transistor QP6 is turned on, and thus substantially the same configuration and function are obtained as Embodiment 2. Since the word line WL is changed to H level, data stored in the memory cell 1 is read to the pair of bit lines BL and /BL. For example, it is assumed that the bit line BL is at L level and the bit line /BL is at H level. Since the bit line /BL is at H level, the P-type MOS transistor QP5, in which the bit line /BL is inputted to the gate terminal, is always turned off when the word line WL is at H level. The bit line BL gradually changes from H level to L level while discharging from H level to which charging has been performed by the precharge circuit 2. When the bit line BL is reduced in potential to a value exceeding a threshold voltage of the P-type MOS transistor QP4, in which the bit line BL is inputted to the gate terminal, the P-type MOS transistor QP4 is turned on and the complementary output /Q of the sense amplifier circuit 3C changes from L level to H level. Then, the N-type MOS transistor QN6 is turned on, in which the complementary output /Q of the sense amplifier circuit 3C is inputted to the gate terminal, and thus the other output Q positively outputs L level. Further, since the other complementary output Q of the sense amplifier circuit 3C is at L level, the N-type MOS transistor QN5 is turned off, in which the output Q is inputted to the gate terminal, and thus the output /Q is not affected. Consequently, the sense amplifier circuit 3C amplifies a potential difference of the pair of bit lines BL and /BL.

When the word line WL is changed from H level to L level, the memory cell 1 is brought to the high impedance state (a state where no data is inputted or outputted). Further, the sense amplifier circuit control signal /EN is changed from L level to H level, and the complementary outputs Q and /Q of the sense amplifier circuit 3C output L level again. Thus, the N-type MOS transistors QN5 and QN6 are turned off, in which the complementary outputs Q and /Q of the sense amplifier circuit 3C are inputted to the gate terminals. Further, the P-type MOS transistor QP6 is turned off and the same operations are performed as Embodiment 2. Moreover, the precharge circuit control signal PCG is changed from H level to L level, and the precharge circuit 2 is activated again to precharge the pair of bit lines BL and /BL to H level.

These operations are repeated.

As described above, it is found that almost the same operations as Embodiment 2 are performed in Embodiment 3.

Embodiment 3 is different from Embodiment 2 in that when the word line WL is at L level, power consumption can be reduced by completely interrupting current applied from the power supply terminal VDD2 of the sense amplifier circuit 3C. As described in Embodiment 2, when the precharge voltage VDD1 of the pair of bit lines BL and /BL is set so as to be equal to a voltage VON, which is expressed by VON=VDD2−VTH−VOFFSET, the P-type MOS transistors QP4 and QP5 constituting the sense amplifier circuit 3C have a gate voltage around a threshold voltage and thus an off leak current increases inevitably. The off leak current applied to the sense amplifier circuit 3C can be completely interrupted by inserting the P-type MOS transistor QP6 in series between the power supply terminal VDD2 and the P-type MOS transistors QP4 and QP5.

In a semiconductor memory product such as a DRAM and SRAM, a write amplifier circuit (for writing, not shown in FIG. 3) is connected to the pair of bit lines BL and /BL in addition to the sense amplifier circuit (for reading). During writing, the pair of bit lines are amplified by the write amplifier circuit to H level and L level, respectively. The sense amplifier circuit has to operate only during reading and thus the sense amplifier circuit control signal /EN is set at H level and the P-type MOS transistor QP6 is turned off during writing. Thus, excessive current is not applied to the sense amplifier circuit 3C and low power consumption can be achieved.

As described above, in addition to the effects of Embodiments 1 and 2, the P-type MOS transistor QP6 having the gate terminal connected to the sense amplifier circuit control signal /EN is connected in series between the power supply terminal VDD2 and the P-type MOS transistors QP4 and QP5, thereby achieving low power consumption.

Embodiment 3 described the case where the P-type MOS transistor QP6 having the gate terminal connected to the sense amplifier circuit control signal /EN is connected in series between the power supply terminal VDD2 and the P-type MOS transistors QP4 and QP5 of Embodiment 2 shown in FIG. 2. The same effect can be obtained by the following configuration: the P-type MOS transistor QP6 having the gate terminal connected to the sense amplifier circuit control signal /EN is connected in series between the power supply terminal VDD2 and the P-type MOS transistors QP4 and QP5 of Embodiment 1 shown in FIG. 1.

For simple explanation of the principal contents of the present invention, the semiconductor integrated circuit of FIG. 3 is constituted of a small number of elements including the memory cell 1, the precharge circuit 2, the sense amplifier circuit 3C, the word line WL, and the pair of bit lines BL and/BL. A plurality of (or a number of) elements may be provided and the same effect as FIG. 3 can be obtained. In Embodiment 3, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

Embodiment 4

Figure 4:
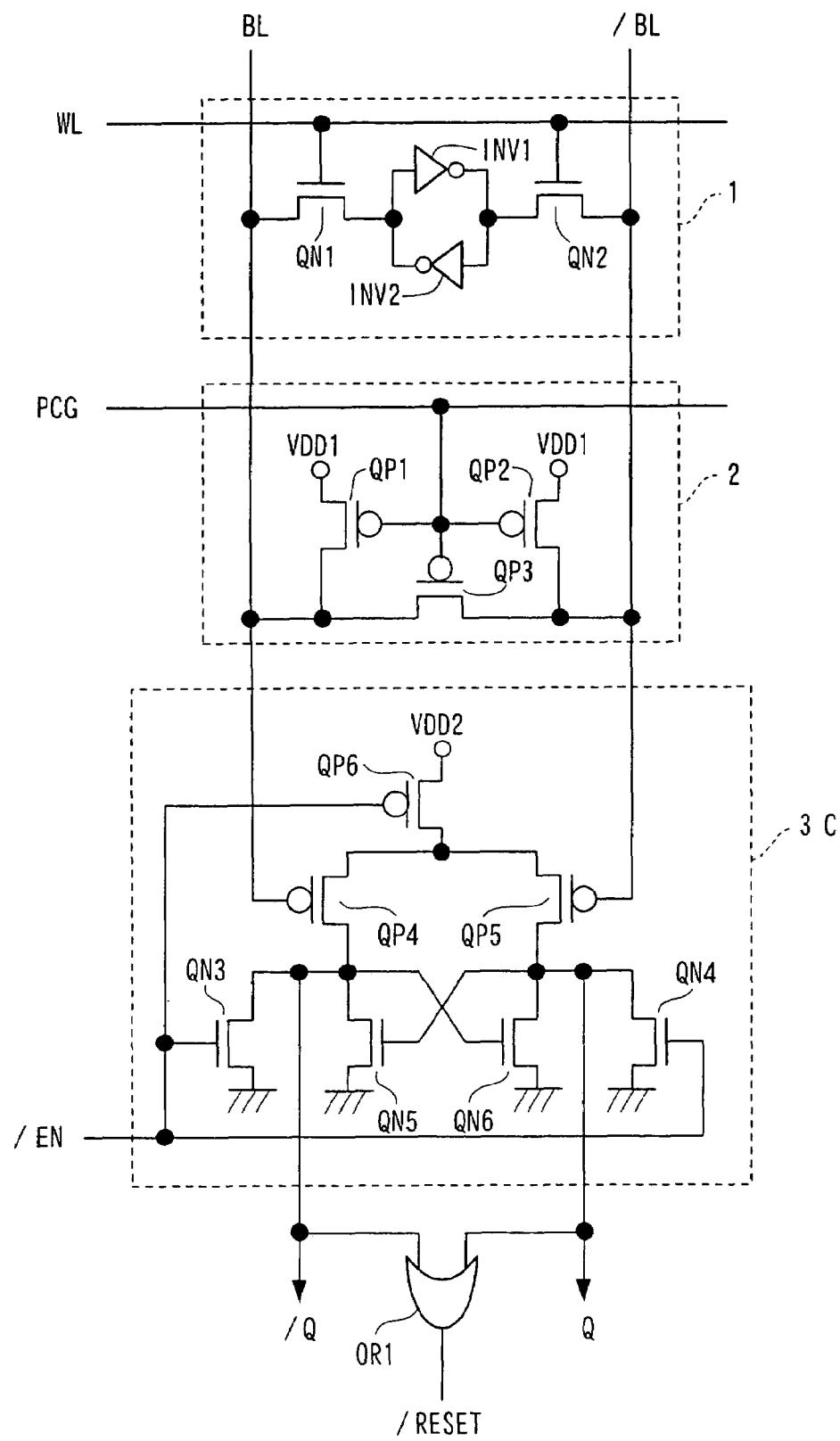
FIG. 4 is a diagram showing the configuration of a semiconductor integrated circuit according to Embodiment 4 of the present invention.

FIG. 4 shows the configuration of a semiconductor integrated circuit according to Embodiment 4 of the present invention.

The semiconductor integrated circuit of FIG. 4 has a memory cell 1, a precharge circuit 2, a sense amplifier circuit 3C, an OR circuit OR1, a word line WL, and a pair of bit lines BL and /BL. Reference character PCG denotes a precharge circuit control signal, reference character /EN denotes a sense amplifier circuit control signal, and reference character /RESET denotes a reset signal. The memory cell 1 and the precharge circuit 2 are configured as Embodiment 1. Further, the sense amplifier circuit 3C is configured as Embodiment 3. The OR circuit OR1 is fed with complementary outputs Q and /Q of the sense amplifier circuit 3C and outputs the reset signal /RESET.

That is, Embodiment 4 comprises the OR circuit OR1 which is fed with the complementary outputs Q and /Q of the sense amplifier circuit 3C of Embodiment 3 shown in FIG. 3. The OR circuit OR1 outputs the reset signal /RESET.

The following will describe the operations of the semiconductor integrated circuit configured thus.

First, when the word line WL is at L level, the precharge circuit control signal PCG is at L level, the precharge circuit 2 is activated, and the pair of bit lines BL and /BL is precharged to H level. Thus, the P-type MOS transistors QP4 and QP5 are turned off, in which the pair of bit lines BL and /BL are inputted to the gate terminals. At this point, the sense amplifier circuit control signal /EN is at H level, the N-type MOS transistors QN3 and QN4 are turned on, in which the sense amplifier circuit control signal /EN is inputted to the gate terminals, and the complementary outputs Q and /Q of the sense amplifier circuit 3C are L level. Thus, the N-type MOS transistors QN5 and QN6 are turned off, in which the complementary outputs Q and /Q of the sense amplifier circuit 3C are inputted to the gate terminals. The P-type MOS transistor QP6 is also turned off and the same operations are performed as Embodiment 2. The reset signal /RESET serving as the output of the OR circuit OR1 is set at L level.

Then, when the precharge circuit control signal PCG is changed from L level to H level, the precharge circuit 2 is brought to a high impedance state. Further, the sense amplifier circuit control signal /EN is changed from H level to L level, and the word line WL is changed from L level to H level. The sense amplifier circuit control signal /EN is at L level, the P-type MOS transistor QP6 is turned on, and thus substantially the same configuration and function are obtained as Embodiment 2. Since the word line WL is changed to H level, data stored in the memory cell 1 is read to the pair of bit lines BL and /BL. For example, it is assumed that the bit line BL is at L level and the bit line /BL is at H level. Since the bit line /BL is at H level, the P-type MOS transistor QP5, in which the bit line /BL is inputted to the gate terminal, is always turned off when the word line WL is at H level. The bit line BL gradually changes from H level to L level while discharging from H level to which charging has been performed by the precharge circuit 2. When the bit line BL is reduced in potential to a value exceeding a threshold voltage of the P-type MOS transistor QP4, in which the bit line BL is inputted to the gate terminal, the P-type MOS transistor QP4 is turned on and the complementary output /Q of the sense amplifier circuit 3C changes from L level to H level. Then, the N-type MOS transistor QN6 is turned on, in which the complementary output /Q of the sense amplifier circuit 3C is inputted to the gate terminal, and thus the other output Q positively outputs L level. Further, since the other complementary output Q of the sense amplifier circuit 3C is at L level, the N-type MOS transistor QN5 is turned off, in which the output Q is inputted to the gate terminal, and thus the output /Q is not affected. Consequently, the sense amplifier circuit 3C amplifies a potential difference of the pair of bit lines BL and /BL.

At this point, since one of the complementary outputs Q and /Q of the sense amplifier circuit 3C is set at H level (in this example, the output /Q is at H level), the reset signal /RESET outputs H level. The reset signal /RESET outputs H level, in which the reset signal /RESET is the output of the OR circuit OR1 fed with the complementary outputs Q and /Q of the sense amplifier circuit 3C. The OR circuit OR1 detects a change in the complementary outputs of the sense amplifier circuit (detects the completion of the amplification of the sense amplifier circuit).

When the word line WL is changed from H level to L level, the memory cell 1 is brought to the high impedance state (a state where no data is inputted or outputted). Further, the sense amplifier circuit control signal /EN is changed from L level to H level, and the complementary outputs Q and /Q of the sense amplifier circuit 3C are to be L level again. Thus, the N-type MOS transistors QN5 and QN6 are turned off, in which the complementary outputs Q and /Q of the sense amplifier circuit 3C are inputted to the gate terminals. Further, the P-type MOS transistor QP6 is turned off and the same operations are performed as Embodiment 2. Moreover, the precharge circuit control signal PCG is changed from H level to L level, and the precharge circuit 2 is activated again to precharge the pair of bit lines BL and /BL to H level. At this point, the reset signal /RESET, which is the output of the OR circuit OR1, outputs L level again.

These operations are repeated.

As described above, the circuit (OR circuit OR1) is provided for detecting the completion of the amplification of the sense amplifier circuit 3C, and the sense amplifier circuit 3C is controlled using the output signal /RESET of the detection circuit OR1, so that the sense amplifier circuit can be operated only in a minimum time period, achieving low power consumption.

In a semiconductor memory product such as a DRAM and SRAM, when the amplification of the sense amplifier circuit 3C is completed, the word line WL is deactivated and the precharge circuit 2 is activated to bring the pair of bit lines BL and /BL to a precharging state. Hence, by using the output signal /RESET of the detection circuit OR1 to control the word line WL and the precharge circuit of the pair of bit lines BL and /BL, the word line WL is activated only in the minimum time period, achieving low power consumption and a speedup due to a shorter cycle time.

Figure 5:
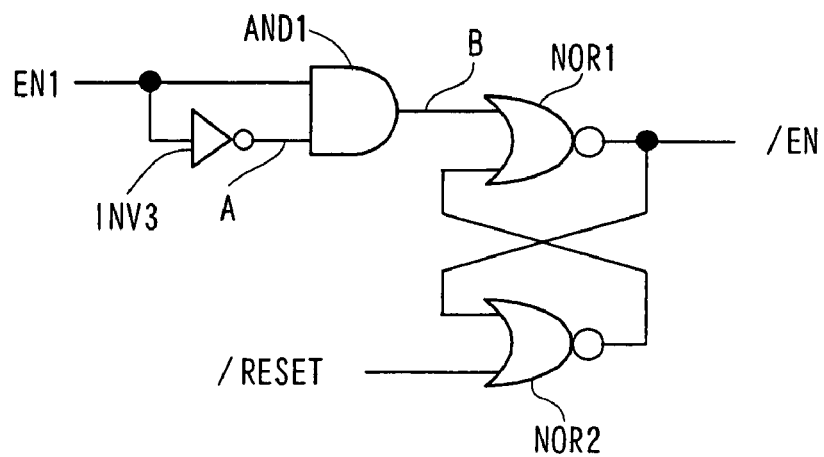
FIG. 5 is a diagram showing an example of a specific circuit configuration for obtaining the circuit of FIG. 4.
Figure 6:
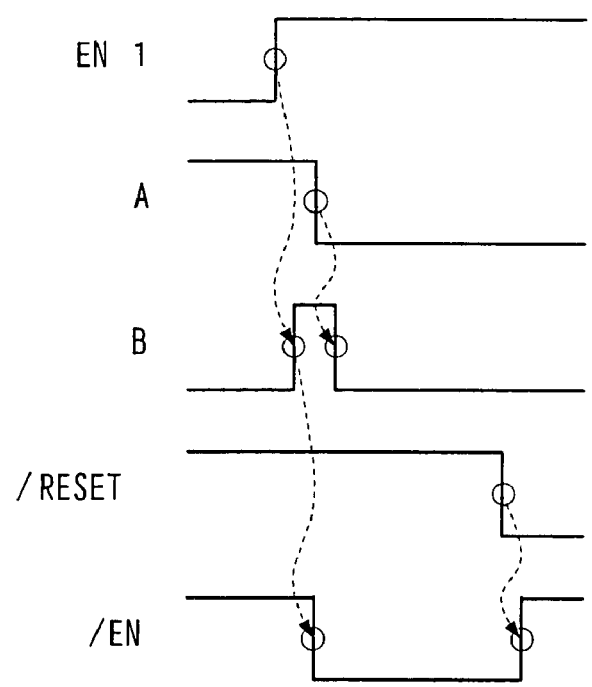
FIG. 6 is a timing chart of the circuit of FIG. 5.

FIG. 5 shows an example of a specific circuit configuration for realizing these operations. FIG. 6 is a timing chart of the circuit shown in FIG. 5.

In FIG. 5, reference numeral INV3 denotes an inverter, reference numeral AND1 denotes an AND circuit, reference numerals NOR1 and NOR2 denote NOR circuits, reference numeral EN1 denotes a sense amplifier start signal, reference character /EN denotes a sense amplifier circuit control signal, reference character /RESET denotes a reset signal, reference character A denotes an output node of the inverter INV3, reference character B denotes an output node of the AND circuit AND1.

The AND circuit AND1 is fed with the sense amplifier start signal EN1 and the output node A of the inverter INV3, to which the sense amplifier start signal EN1 is inputted, and the AND circuit AND1 outputs the node B. The NOR circuits NOR1 and NOR2 constitute an RS latch circuit. The RS latch circuit is fed with the node B as a set signal and the reset signal /RESET as a reset signal, and outputs the sense amplifier circuit control signal /EN.

Referring to FIG. 6, the following will describe the operations of the circuit configured thus.

When the sense amplifier start signal EN1 is changed from L level to H level, the output of the node A changes from H level to L level after the delay time of the inverter INV3. Thus, the AND circuit AND1 outputs an H-level pulse, which corresponds the delay time of the inverter INV3, to the node B. The H-level pulse of the node B acts as the set signal of the RS latch circuit constituted of the NOR circuits NOR1 and NOR2. The sense amplifier circuit control signal /EN serving as the output of the RS latch circuit changes from H level to L level. When the sense amplifier circuit control signal /EN is set at L level, the sense amplifier circuit is activated and the reset signal /RESET is changed from H level to L level after a predetermined period of time (because the completion of the amplification of the sense amplifier circuit is detected) When the reset signal /RESET is changed to L level, the RS latch circuit constituted of the NOR circuits NOR1 and NOR2 is reset and thus the sense amplifier circuit control signal /EN is changed from L level to H level.

As described above, with the circuit configuration of FIG. 5, it is possible to generate a signal for activating the sense amplifier circuit 3C only in the minimum time period.

The circuit configuration of FIG. 5 is devised for the control signal of the sense amplifier circuit 3C. With this circuit configuration, it is possible to similarly control the activation and deactivation of the word line WL and the precharge circuit of the pair of bit lines BL and /BL.

Embodiment 4 described the case where the OR circuit OR1 is connected to the complementary outputs Q and /Q of the sense amplifier circuit 3C of Embodiment 3 shown in FIG. 3. The same effect can be obtained also when the OR circuit OR1 is connected to the complementary outputs Q and /Q of the sense amplifier circuit 3A of Embodiment 1 shown in FIG. 1 and when the OR circuit OR1 is connected to the complementary outputs Q and /Q of the sense amplifier circuit 3B of Embodiment 2 shown in FIG. 2.

For simple explanation of the principal contents of the present invention, the semiconductor integrated circuit of FIG. 4 is constituted of a small number of elements including the memory cell 1, the precharge circuit 2, the sense amplifier circuit 3C, the word line WL, and the pair of bit lines BL and/BL. A plurality of (or a number of) elements may be provided and the same effect as FIG. 4 can be obtained. In Embodiment 4, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

Embodiment 5

Figure 7:
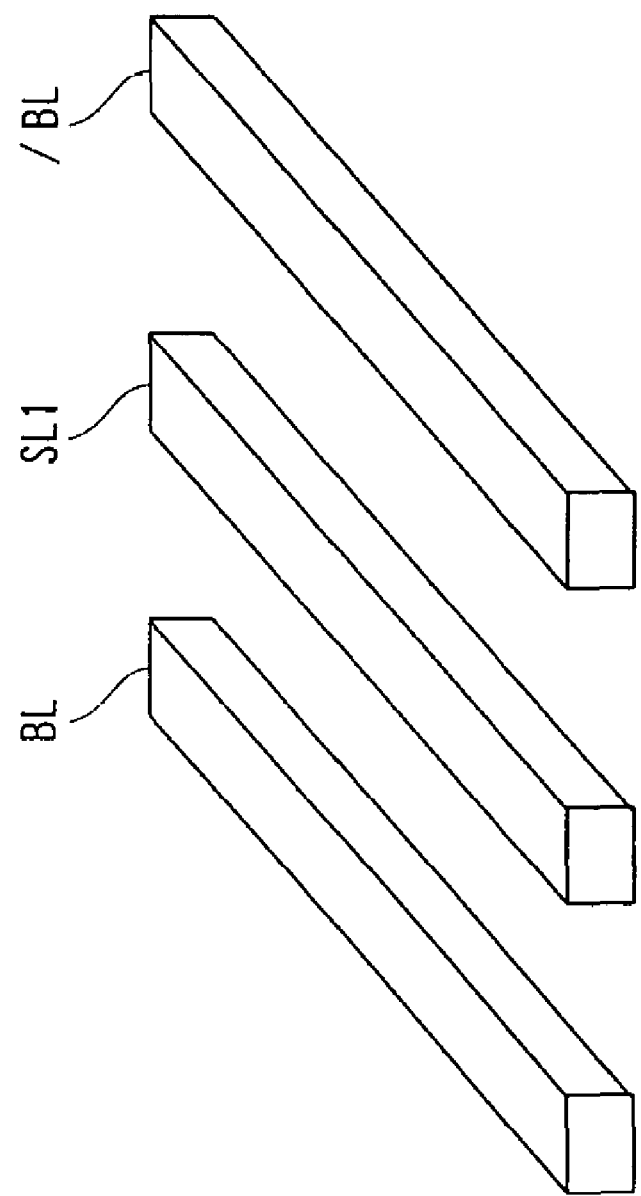
FIG. 7 is a diagram showing the configuration of a semiconductor integrated circuit according to Embodiment 5 of the present invention.

FIG. 7 shows the configuration of a semiconductor integrated circuit according to Embodiment 5 of the present invention.

The semiconductor integrated circuit of FIG. 7 has a pair of bit lines BL and /BL and a shield wire SL1.

In Embodiments 1 to 4, the pair of bit lines BL and /BL connected to the sense amplifier circuits 3A to 3C is generally disposed in parallel in the same wiring layer as shown in FIG. 7. Thus, a coupling capacitance is present between the bit lines BL and /BL. In the case where a coupling capacitance is present between the bit lines BL and /BL, the following problem occurs: when the word line WL is changed to H level and data is read from the memory cell 1 to the pair of bit lines BL and /BL so that one of the bit lines BL and /BL is reduced from H level to L level, the bit line (e.g., /BL) that is otherwise to be kept at H level is reduced to L level in response to the other bit line (e.g., /BL) having been reduced in level, due to the influence of the coupling capacitance between the bit lines BL and /BL.

As described in Embodiments 1 to 3, when the precharge voltage VDD1 of the pair of bit lines BL and /BL is set so as to be equal to a voltage VON, which is expressed by VON=VDD2−VTH−VOFFSET, the P-type MOS transistors QP4 and QP5 constituting the sense amplifier circuit 3A (3B, 3C) have a gate voltage around a threshold voltage. Thus, when the bit line (e.g., BL) to be kept at H level is changed to L level, the P-type MOS transistor (e.g., QP5) to be turned off is turned on, resulting in higher power consumption and a malfunction of the sense amplifier circuit.

In order to solve this problem, as shown in FIG. 7, the shield wire SL1 is provided for reducing a coupling capacitance between the bit lines BL and /BL, thereby preventing an increase in power consumption and a malfunction of the sense amplifier circuit.

In Embodiment 5, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

Embodiment 6

Figure 8:
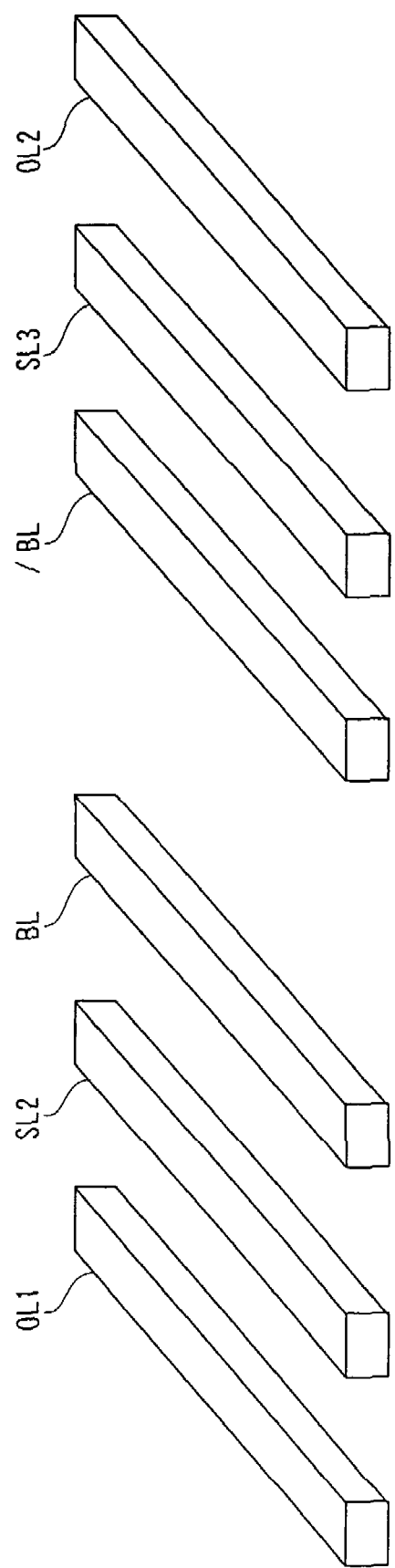
FIG. 8 is a diagram showing the configuration of a semiconductor integrated circuit according to Embodiment 6 of the present invention.
Figure 9:
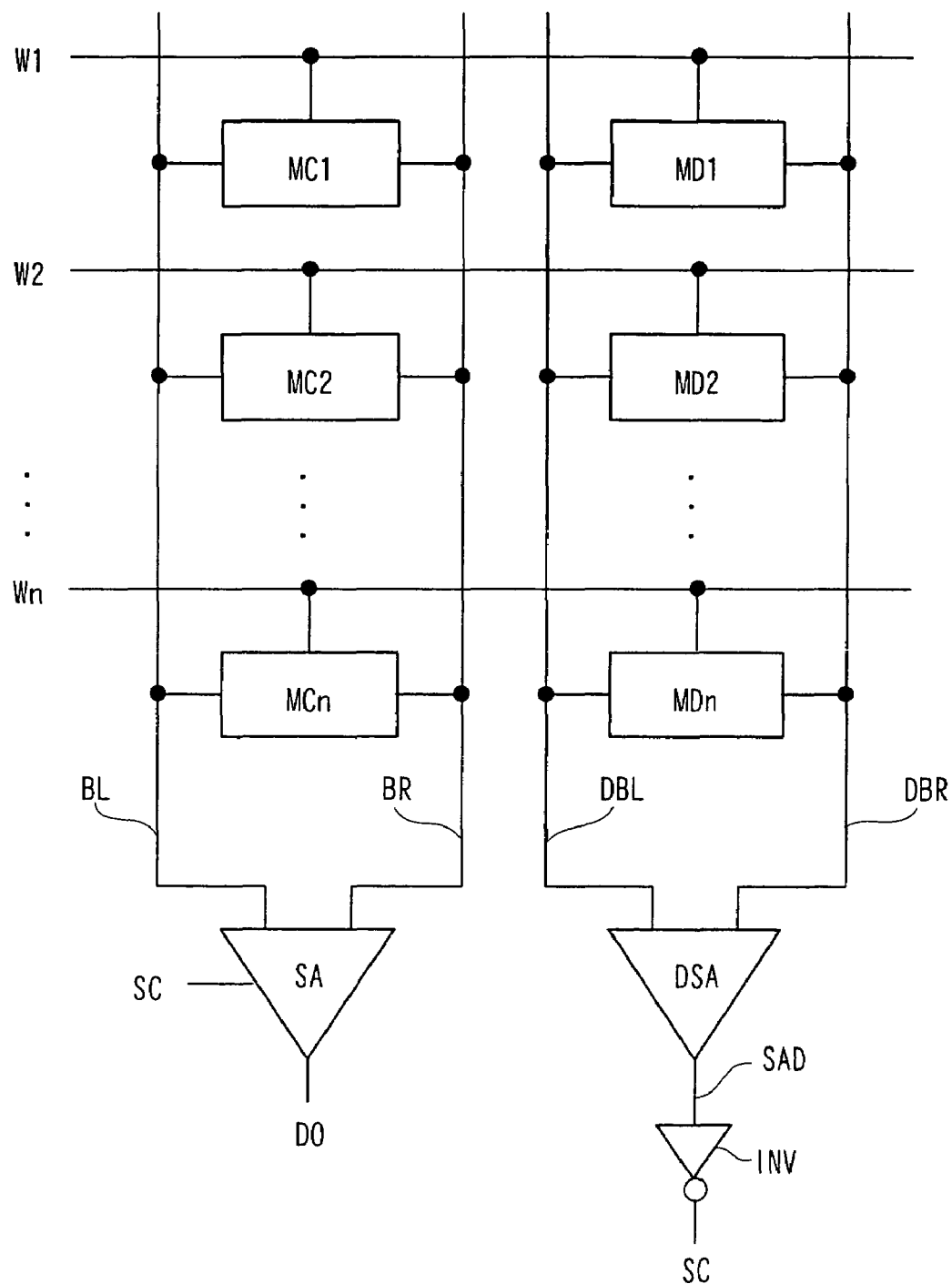
FIG. 9 is a diagram showing the configuration of a semiconductor integrated circuit of a known technique.

FIG. 8 shows the configuration of a semiconductor integrated circuit according to Embodiment 6 of the present invention.

The semiconductor integrated circuit of FIG. 8 has a pair of bit lines BL and /BL, shield wires SL2 and SL3, and wires OL1 and OL2 which are adjacent to the pair of bit lines.

In Embodiments 1 to 4, the pair of bit lines BL and /BL connected to the sense amplifier circuits 3A to 3C is generally disposed in parallel in the same wiring layer as shown in FIG. 8. Further, in a semiconductor memory product such as a DRAM and SRAM, since two or more pairs of bit lines are disposed, another pair of bit lines generally adjoins to the pair of bit lines BL and /BL.

That is, the wires OL1 and OL2 adjacent to the pair of bit lines BL and /BL are disposed as shown in FIG. 8. Thus, a coupling capacitance is present between the bit line BL and the adjacent wire OL1 and between the bit line /BL and the adjacent wire OL2, respectively. When a coupling capacitance is present between the pair of bit lines and the adjacent wires, the following problem occurs: in the case where one of the bit lines BL and /BL is reduced from H level to L level when the word line WL is changed to H level and data is read from the memory cell 1 by the pair of bit lines BL and /BL, the bit line (e.g., /BL) to be kept at H level is reduced to L level in response to one of the adjacent wires (e.g., OL2) that have been reduced in level, due to the influence of the coupling capacitance between the pair of bit lines and the adjacent wires.

As described in Embodiments 1 to 3, when the precharge voltage VDD1 of the pair of bit lines BL and /BL is set so as to be equal to a voltage VON, which is expressed by VON=VDD2−VTH−VOFFSET, the P-type MOS transistors QP4 and QP5 constituting the sense amplifier circuit 3A (3B, 3C) have a gate voltage around a threshold voltage. Thus, when the bit line (e.g., /BL) to be kept at H level is changed to L level, the P-type MOS transistor (e.g., QP5) to be turned off is turned on, resulting in higher power consumption and a malfunction of the sense amplifier circuit.

In order to solve this problem, as shown in FIG. 8, the shield wires SL2 and SL3 are provided for reducing a coupling capacitance between the pair of bit lines and the adjacent wires, thereby preventing an increase in power consumption and a malfunction of the sense amplifier circuit.

In Embodiment 6, the semiconductor memory product such as a DRAM and SRAM was discussed as an example. The present invention is applicable to all the cases where a pair of complementary signal lines and a precharger for precharging the pair of complementary signal lines are provided, the pair of complementary signal lines has a small potential difference, and the potential difference is amplified.

The semiconductor integrated circuit of the present invention eliminates the need for generating a start signal of a sense amplifier circuit and achieves low power consumption, high speed, and a small area in the sense amplifier circuit for amplifying a small potential difference of a pair of complementary signal lines. Thus, the semiconductor integrated circuit is particularly useful as a sense amplifier circuit and so on for amplifying a small potential difference of a pair of complementary signal lines.

What is claimed is:

1. A semiconductor integrated circuit, comprising:
a word line,
a pair of bit lines,
a memory cell disposed on an intersection of the word line and the pair of bit lines,
a precharge circuit for precharging the pair of bit lines at a first voltage, and
a sense amplifier circuit for amplifying a potential difference of the pair of bit lines, the sense amplifier circuit being supplied with a second voltage,
wherein the first voltage is substantially equal to an on voltage of the sense amplifier circuit, the on voltage being obtained by adding an offset voltage of the sense amplifier circuit to an on voltage of a transistor constituting the sense amplifier circuit, or the first voltage is a voltage between the on voltage of the sense amplifier circuit and the second voltage.

2. The semiconductor integrated circuit according to claim 1, wherein the sense amplifier circuit is controlled by a sense amplifier circuit control signal, and complementary outputs of the sense amplifier circuit have a same voltage level in response to the sense amplifier circuit control signal when the sense amplifier circuit is deactivated.

3. The semiconductor integrated circuit according to claim 2, wherein the sense amplifier circuit has first to fourth transistors, a power supply of the second voltage is connected to source terminals of the first and second transistors, signal lines from the pair of bit lines are connected respectively to gate terminals of the first and second transistors, source terminals of the third and fourth transistors are grounded, a sense amplifier circuit control signal line is connected to gate terminals of the third and fourth transistors, drain terminals of the first and third transistors are connected to each other so as to constitute one of the complementary outputs of the sense amplifier circuit, and drain terminals of the second and fourth transistors are connected to each other to constitute the other of the complementary outputs of the sense amplifier circuit.

4. The semiconductor integrated circuit according to claim 3, wherein the sense amplifier circuit further has fifth and sixth transistors, source terminals of the fifth and sixth transistors are grounded, a drain terminal of the fifth transistor is connected to the drain terminal of the first transistor, a gate terminal of the fifth transistor is connected to the drain terminal of the second transistor, a drain terminal of the sixth transistor is connected to the drain terminal of the second transistor, and a gate terminal of the sixth transistor is connected to the drain terminal of the first transistor.

5. The semiconductor integrated circuit according to claim 1, wherein when the sense amplifier circuit is deactivated, power of the sense amplifier circuit is turned off by the sense amplifier circuit control signal.

6. The semiconductor integrated circuit according to claim 1, further comprising an amplification detection circuit which has input terminals to which complementary outputs of the sense amplifier circuit are fed, and a circuit which deactivates the sense amplifier circuit and the word line and activates the precharge circuit based on an output of the amplification detection circuit.

7. The semiconductor integrated circuit according to claim 1, wherein a wire for creating a shield against influence of coupling between the pair of bit lines is formed between the pair of bit lines.

8. The semiconductor integrated circuit according to claim 1, wherein a pair of wires for creating a shield against influence of coupling on the pair of bit lines are formed outside the pair of signal lines.

9. A semiconductor integrated circuit, comprising:
a pair of complementary signal lines,
a precharger for precharging the pair of complementary signal lines at a first voltage, and
an amplifier for amplifying a potential difference of the pair of complementary signal lines, the amplifier being supplied with a second voltage,
wherein the first voltage is substantially equal to an on voltage of the amplifier, the on voltage being obtained by adding an offset voltage of the amplifier to an on voltage of a transistor constituting the amplifier, or the first voltage is a voltage between the on voltage of the amplifier and the second voltage.

10. The semiconductor integrated circuit according to claim 9, wherein the amplifier is controlled by an amplifier control signal, and complementary outputs of the amplifier have a same voltage level in response to the amplifier control signal when the amplifier is deactivated.

11. The semiconductor integrated circuit according to claim 10, wherein the amplifier has first to fourth transistors, a power supply of the second voltage is connected to source terminals of the first and second transistors, the complementary signal lines are connected respectively to gate terminals of the first and second transistors, source terminals of the third and fourth transistors are grounded, an amplifier control signal line is connected to gate terminals of the third and fourth transistors, drain terminals of the first and third transistors are connected to each other to constitute one of the complementary outputs of the amplifier, and drain terminals of the second and fourth transistors are connected to each other to constitute the other of the complementary output of the amplifier.

12. The semiconductor integrated circuit according to claim 11, wherein the amplifier further has fifth and sixth transistors, source terminals of the fifth and sixth transistors are grounded, a drain terminal of the fifth transistor is connected to the drain terminal of the first transistor, a gate terminal of the fifth transistor is connected to the drain terminal of the second transistor, a drain terminal of the sixth transistor is connected to the drain terminal of the second transistor, and a gate terminal of the sixth transistor is connected to the drain terminal of the first transistor.

13. The semiconductor integrated circuit according to claim 9, wherein when the amplifier is deactivated, power of the amplifier is turned off by an amplifier control signal.

14. The semiconductor integrated circuit according to claim 9, further comprising an amplification detector which has an input terminal to which complementary output of the amplifier is fed, and a circuit which turns off power of the amplifier and activates the precharger based on an output of the amplification detector.

15. The semiconductor integrated circuit according to claim 9, wherein a wire for creating a shield against influence of coupling between the pair of complementary signal lines inputted to the amplifier is formed between the pair of complementary signal lines.

16. The semiconductor integrated circuit according to claim 9, where in a pair of wires for creating a shield against influence of coupling on the pair of complementary signal lines inputted to the amplifier is formed outside the pair of complementary signal lines.

* * * * *